United States Patent [19]

Mizuide

[11] Patent Number: 4,769,617
[45] Date of Patent: Sep. 6, 1988

[54] DIFFERENTIAL AMPLIFIER CIRCUIT
[75] Inventor: Yasuo Mizuide, Kawasaki, Japan
[73] Assignee: Kabushiki Kaisha Toshiba, Kawasaki, Japan
[21] Appl. No.: 103,815
[22] Filed: Oct. 2, 1987
[30] Foreign Application Priority Data Oct. 7, 1986 [JP] Japan .................... 61-238381

[51] Int. Cl.$^4$ .............................. H03F 3/45
[52] U.S. Cl. .................... 330/260; 330/252
[58] Field of Search ............ 330/69, 252, 259, 260, 330/261

[56] References Cited
U.S. PATENT DOCUMENTS 4,468,629 8/1984 Choma, Jr. ...................... 330/260

OTHER PUBLICATIONS

Japanese Patent Publication (Kokoku) No. 47-44296, Nov. 9, 1972, Dirk Brom (Transliterated) et al., (Philips).
Japanese Patent Disclosure (Kokai) No. 60-254905, Dec. 16, 1985, Wilhelm. Wilhelm (Transliterated) (Siemens).

Primary Examiner—James B. Mullins
Attorney, Agent, or Firm—Finnegan, Henderson, Farabow, Garrett and Dunner

[57] ABSTRACT

A differential amplifier circuit includes a pair of differential input signal terminals, first and second current output terminals, a first transistor whose collector is connected to the first current output terminal, a second transistor whose collector is connected to the second current output terminal, a third transistor whose collector and base are respectively connected to the emitter of the first transistor and the emitter of the second transistor, a fourth transistor whose collector and base are respectively connected to the emitter of the second transistor and the emitter of the first transistor, first and second resistors, and a constant current source circuit connected to the emitters of the third and fourth transistors via the first and seond resistors. Furthermore, the differential amplifier circuit includes first and second emitter followers, the input terminals of which are respectively connected to the pair of differential input signal terminals, and the output terminals of which are respectively connected to the bases of the first and second transistors.

10 Claims, 4 Drawing Sheets

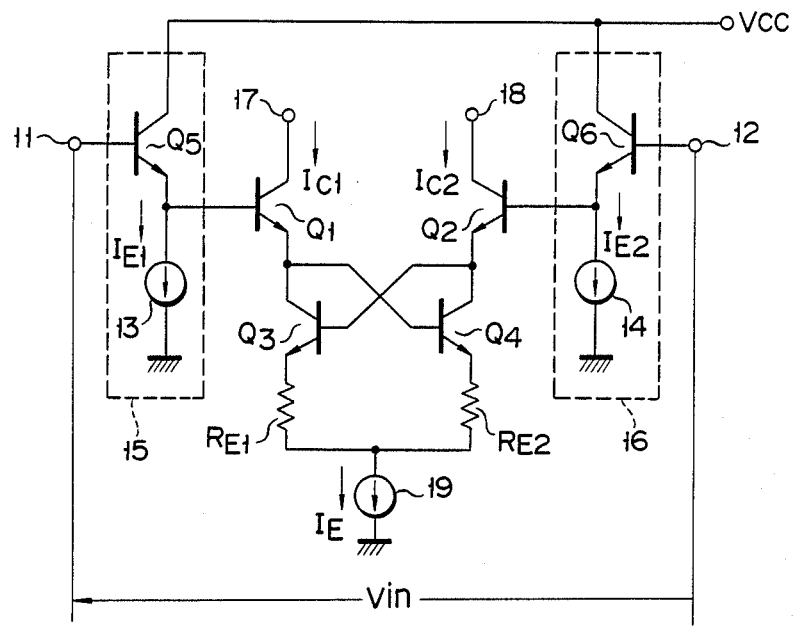
F I G. 5
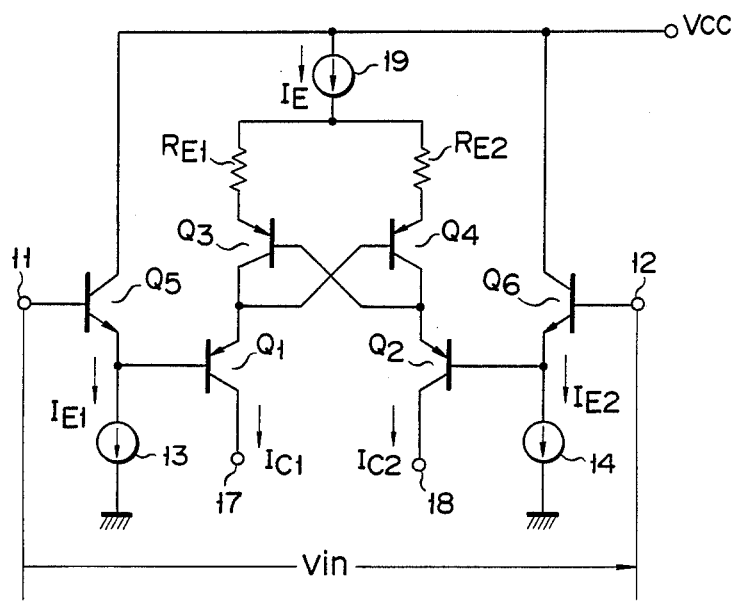
F I G. 6

DIFFERENTIAL AMPLIFIER CIRCUIT

BACKGROUND OF THE INVENTION

The present invention relates to a differential amplifier circuit having integrated bipolar transistors.

Various conventional differential amplifier circuits formed of bipolar transistors are known. FIG. 1 shows a differential amplifier circuit of this type. This differential amplifier circuit includes a differential pair of NPN transistors Q1 and Q2 whose bases are respectively connected to a pair of differential input terminals 41 and 42, and whose collectors are respectively connected to current output terminals 43 and 44. The emitters of transistors Q1 and Q2 are respectively connected to the collectors of NPN transistors Q3 and Q4, whose emitters are connected to constant current source 45 via resistors RE1 and RE2. The collector and base of transistor Q3 are respectively connected to the base and collector of transistor Q4. Resistors RE1 and RE2 each have resistance RE.

In the differential amplifier circuit with the above arrangement, when a voltage difference between differential input terminals 41 and 42 is 0, current I1 flowing through transistors Q1 and Q3 is equal to current I2 flowing through transistors Q2 and Q4, and the current value is ½ constant current IE. In a low input signal range, if voltage difference $V_{in}$ between differential input terminals 41 and 42 is increased, input current IB1 of input terminal 41 and base current IB4 of transistor Q4 are increased. As a result, collector current IC2 of transistor Q2 is increased, while collector current IC1 of transistor Q1 is decreased, thereby obtaining input/output characteristics as shown in FIG. 2. Accordingly, input resistance $R_{in}$ of the differential amplifier circuit becomes negative, and its value is determined by resistors RE1 and RE2 of the emitter circuit formed of input transistors Q1 and Q2 and current amplification factor $h_{FE}$ thereof, as follows:

$$R_{in} = -h_{FE} \times RE \quad (1)$$

If $h_{FE} = 100$ and $RE1 = RE2 = °\Omega$, $R_{in} = -2$ kΩ.

As shown in FIG. 3, when signal source 61 having positive signal source resistance $R_s$ is connected to differential amplifier circuit 62 having negative input resistance $R_{in}$, if a signal source voltage and an input voltage of differential amplifier 62 are represented by $V_s$ and $V_{in}$, respectively, transfer characteristics can be represented by a resistance division of $R_S$ and $R_{in}$, as follows:

$$V_{in}/V_s = R_{in}/(R_s + R_{in}) \quad (2)$$

If $R_s$ of equation (2) is constant, the relationship between $R_{in}$ and the transfer characteristics can be represented by a graph shown in FIG. 4. That is, when $R = |R_{in}|$, transfer characteristics provide an extremely large value, as follows:

$$V_{in}/V = -\infty \quad (3)$$

wherein the transfer characteristics greatly change in correspondence with changes in $R_{in}$, when $RE = |R_{in}|$. In this case, input resistance $R_{in}$ ($= -h_{FE} \times R$) varies in correspondence with a variation in $h_{FE}$ of transistors Q1 and Q2 in the differential amplifier circuit, and hence the above transfer characteristics change greatly. Therefore, if $R_{in}$ of the differential amplifier circuit is −2 kΩ, and the differential input terminals of the differential amplifier circuit are connected to a pair of output terminals of a signal source having a resistance substantially corresponding to $R_s = 2$ kΩ, e.g., a Hall element of a Hall motor, signal source voltage $V_s$ cannot be transferred, as input voltage $V_{in}$, with its amplitude kept substantially unchanged.

SUMMARY OF THE INVENTION

It is an object of the present invention to provide a differential amplifier circuit which is scarcely affected by a variation in negative input resistance, and can be stably operated by an input voltage substantially equal to a signal voltage supplied from a signal source having a relatively low signal source resistance.

In order to achieve the above object of the present invention, there is provided a differential amplifier circuit comprising a pair of differential input signal terminals; first and second current output terminals; first and second emitter follower circuits whose input terminals are respectively connected to the pair of differential input signal terminals; a first transistor whose base and collector are respectively connected to an output terminal of the first emitter follower circuit and the first current output terminal; a second transistor whose base and collector are respectively connected to an output terminal of the second emitter follower circuit and the second current output terminal; a third transistor whose collector and base are respectively connected to emitters of the first and second transistors; a fourth transistor whose collector and base are respectively connected to the emitters of the second and first transistors; first and second resistors; and a constant current source circuit connected to emitters of the third and fourth transistors via the first and second resistors.

According to the present invention, since emitter follower circuits are arranged in the input stages and an absolute value of the negative input resistance is set to be large, even if a signal source having a low signal resistance is used, the differential amplifier can be stably operated without being greatly affected by a variation in negative input resistance.

BRIEF DESCRIPTION OF THE DRAWINGS

FIG. 5 is a circuit diagram of a differential amplifier circuit according to an embodiment of the present invention; and FIGS. 6 to 8 are circuit diagrams showing modifications of the differential amplifier circuit in FIG. 5.

DETAILED DESCRIPTION OF THE PREFERRED EMBODIMENT

Figure 1:
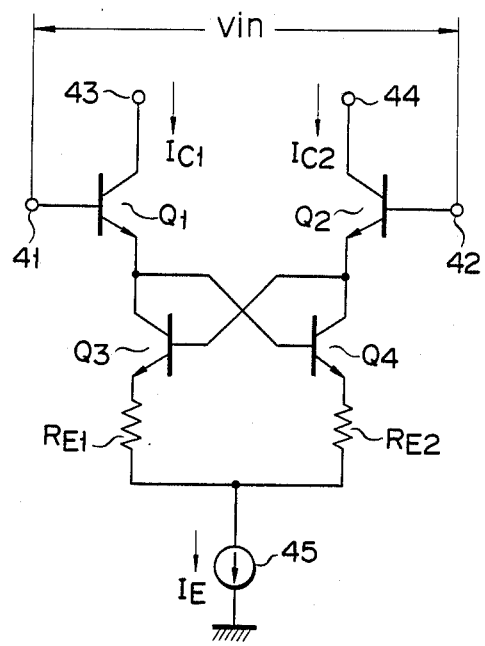
FIG. 1 is a circuit diagram of a conventional differential amplifier circuit having a negative input resistance.

An embodiment of the present invention will be described with reference to the accompanying drawings in detail hereinafter.

FIG. 5 shows an integrated differential amplifier circuit. The differential amplifier circuit includes a pair of differential input terminals 11 and 12, NPN input transistors Q5 and Q6, whose bases are respectively connected to differential input terminals 11 and 12, and whose collectors are connected to power source node $V_{cc}$, and current source circuits 13 and 14 respectively connected to the emitters of transistors Q5 and Q6. Transistor Q5 and current source circuit 13, and transistor Q6 and current source circuit 14 constitute emitter followers 15 and 16, respectively. The collector of NPN transistor Q1 is connected to current output terminal 17, while the base of transistor Q1 is connected to the emitter of transistor Q5. The collector of NPN transistor Q2 is connected to current output terminal 18, while the base of transistor Q2 is connected to the emitter of transistor Q6. The emitters of transistors Q1 and Q2 are connected to the collectors of NPN transistors Q3 and Q4. The base and collector of transistor Q3 are connected to the collector and base of transistor Q4, respectively. The emitters of transistors Q3 and Q4 are connected to constant current source circuit 19 via resistive elements RE1 and RE2 each having resistance RE.

Figure 2:
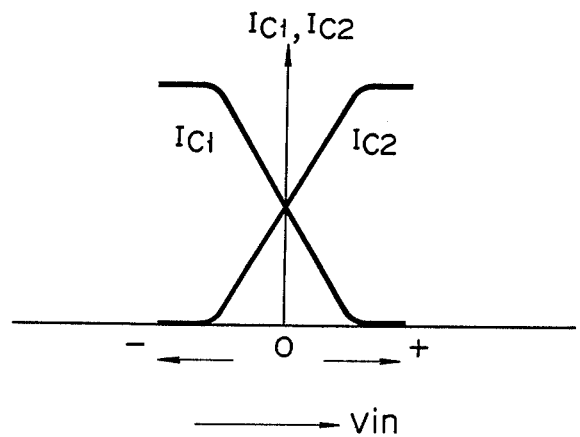
FIG. 2 shows voltage-current characteristics of the differential amplifier circuit in FIG. 1.
Figure 3:
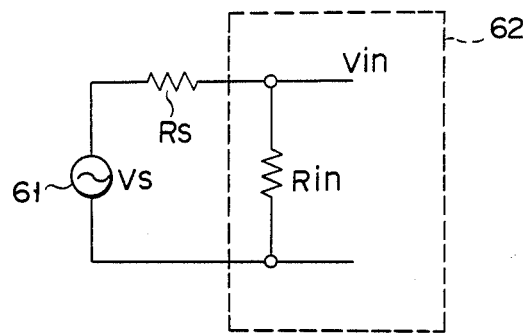
FIG. 3 is a circuit diagram schematically showing electrical connections between a signal source having a low internal resistance and the differential amplifier circuit in FIG. 1.
Figure 4:
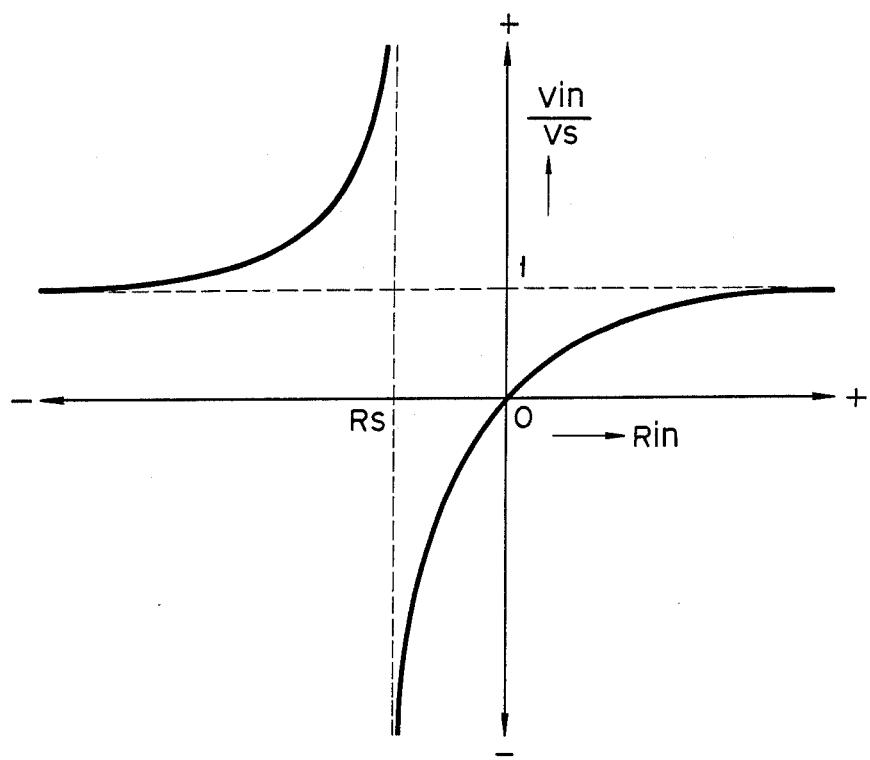
FIG. 4 is a graph showing transfer characteristics of the circuit in FIG. 3.

In the differential amplifier circuit with the above-described arrangement, transfer characteristics in a low input signal range substantially correspond to those shown in FIG. 2, but input resistance $R_{in}$ is expressed as follows:

$$R_{in} = -h_{FE}2 \times RE \quad (4)$$

where $h_{FE}$ represents a current amplification factor of each of transistors Q1, Q2, Q5, and Q6. Accordingly, the absolute value of $R_{in}$ in equation (4) is $h_{FE}$ times the $R_{in}(=-h_{FE} \times RE)$ in equation (1) without changing its negative polarity.

Therefore, if $h_{FE}=100$ and $RE=20$ Ω, $R_{in}=-200$ kΩ. If the differential amplifier circuit is connected to a signal source having positive signal source resistance $R_s$ of a relatively low value (e.g., 2 kΩ), the transfer characteristics are:

$$V_{in}/V_s = R_{in}/(R_s + R_{in}) = -200 \ k\Omega/--198 \ k\Omega \approx 1 \quad (5)$$

Thus, input voltage $V_{in}$ substantially equal to signal source voltage $V_s$ can be obtained. In this case, even if input resistance $R_{in}$ is negative, the transfer characteristics will not greatly change as compared with the conventional case, and are scarcely affected by a variation in $R_{in}$ caused by a variation in $h_{FE}$, because an absolute value of $R_{in}$ is sufficiently larger than signal source resistance $R_s$.

Figure 7:
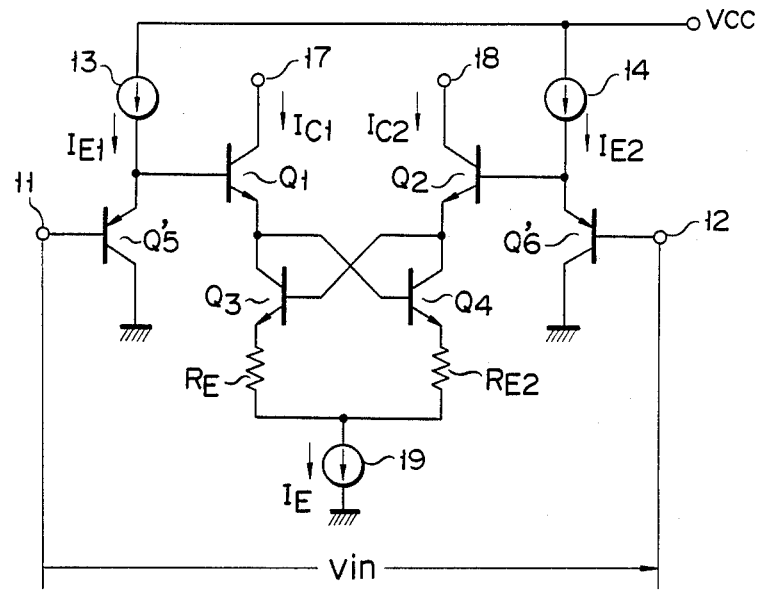

Note that the present invention is not limited to the above-described embodiment, but various changes and modifications can be made. For example, NPN transistors Q1, Q2, Q3, and Q4 in FIG. 5 may be replaced by PNP transistors Q1', Q2', Q3', and Q4', while the polarities of input voltage $V_{in}$ between differential input terminals 11 and 12 may be reversed, as shown in FIG. 6. Further, NPN transistors Q5 and Q6 in FIG. 5 may be replaced by PNP transistors Q5' and Q6', while polarities of input voltage $V_{in}$ between differential input terminals 11 and 12 may be reversed, as shown in FIG. 7. In the circuit shown in FIG. 6, if current amplification factors of transistors Q5 and Q6 used for emitter followers, and transistors Q1' and Q2' used for input are respectively represented by $h_{FE}$ and $h_{FE}'$, then $R_{in} = -h_{FE} \times h_{FE}' \times RE$. Accordingly, in the circuit shown in FIG. 7, if the current amplification factors of transistors Q5' and Q6' used for the emitter followers, and input transistors Q1 and Q2 are respectively represented by $h_{FE}'$ and $h_{FE}$, then $R_{in} = -h_{FE}' \times h_{FE} \times RE$.

Figure 8:
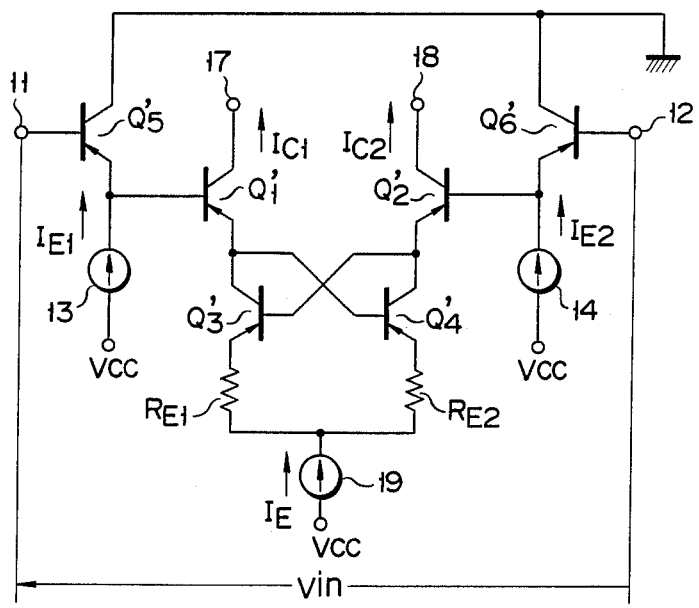

Note that NPN transistors Q1 to Q4 may be replaced by PNP transistors, as shown in FIG. 8, while the polarities of the power source may be reversed.

What is claimed is:

1. A differential amplifier circuit comprising:
   a pair of differential input signal terminals;
   first and second current output terminals;
   first and second emitter follower circuits whose input terminals are respectively connected to said pair of differential input signal terminals;
   a first transistor whose base and collector are respectively connected to an output terminal of said first emitter follower circuit and said first current output terminal;
   a second transistor whose base and collector are respectively connected to an output terminal of said second emitter follower circuit and said second current output terminal;
   a third transistor whose collector and base are respectively connected to emitters of said first and second transistors;
   a fourth transistor whose collector and base are respectively connected to the emitters of said second and first transistors;
   first and second resistive means; and
   a constant current source circuit connected to emitters of said third and fourth transistors via said first and second resistive means.

2. A differential amplifier circuit according to claim 1, wherein said first and second resistive means are each formed of a resistor having the same resistance.

3. A differential amplifier circuit according to claim 2, wherein said first to fourth transistors are each formed of an NPN transistor.

4. A differential amplifier circuit according to claim 3, wherein said first emitter follower circuit includes a first current source and a fifth transistor whose emitter is connected to the base of said first transistor and to said first current source and said second emitter follower circuit includes a second current source and a sixth transistor whose emitter is connected to the base of said second transistor and to said second current source, the bases of said fifth and sixth transistors being connected to said pair of differential input signal terminals and the collectors of said fifth and sixth transistors being connected to a power source terminal.

5. A differential amplifier circuit according to claim 4, wherein said fifth and sixth transistors are each formed of an NPN transistor.

6. A differential amplifier circuit according to claim 4, wherein said fifth and sixth transistors are each formed of a PNP transistor.

7. A differential amplifier circuit according to claim 2, wherein said first to fourth transistors are each formed of a PNP transistor.

8. A differential amplifier circuit according to claim 7, wherein said first emitter follower circuit includes a first current source and a fifth transistor whose emitter is connected to the base of said first transistor and to said first current source and said second emitter follower circuit includes a second current source and a sixth transistor whose emitter is connected to the base of said second transistor and to said second current source, the bases of said fifth and sixth transistors being connected to said pair of differential input signal terminals and the collectors of said fifth and sixth transistors being connected to a power source terminal.

9. A differential amplifier circuit according to claim 8, wherein said fifth and sixth transistors are each formed of an NPN transistor.

10. A differential amplifier circuit according to claim 8, wherein said fifth and sixth transistors are each formed of a PNP transistor.

* * * * *